(12) United States Patent
Wu et al.

(10) Patent No.: US 12,635,323 B2
(45) Date of Patent: May 19, 2026

(54) MICROLED DISPLAY PANEL

(71) Applicant: Prilit Optronics, Inc., Tainan City (TW)

(72) Inventors: Biing-Seng Wu, Tainan City (TW); Chao-Wen Wu, Tainan City (TW); Hsing-Ying Lee, Tainan City (TW); Hsin-Hung Chen, Tainan City (TW)

(73) Assignee: Prilit Optronics, Inc., Tainan City (TW)

( * ) Notice: Subject to any disclaimer, the term of this patent is extended or adjusted under 35 U.S.C. 154(b) by 711 days.

(21) Appl. No.: 18/091,827

(22) Filed: Dec. 30, 2022

(65) Prior Publication Data

US 2023/0327064 A1      Oct. 12, 2023

Related U.S. Application Data

(60) Provisional application No. 63/329,571, filed on Apr. 11, 2022.

(51) Int. Cl.
| | |
|---|---|
| H10H 20/857 | (2025.01) |
| G09G 3/32 | (2016.01) |
| H10H 20/831 | (2025.01) |
| H10H 29/14 | (2025.01) |

(52) U.S. Cl.
CPC ............ H10H 20/857 (2025.01); G09G 3/32 (2013.01); H10H 20/831 (2025.01); H10H 29/142 (2025.01); *G09G 2310/08* (2013.01)

(58) Field of Classification Search
CPC .. H10H 20/831; H10H 29/142; H10H 20/857; H10H 20/83; G09G 2310/08; G09G 2300/0452; G09G 3/3216; G09G 3/32; H01L 25/0753; G09F 9/33
See application file for complete search history.

(56) References Cited

U.S. PATENT DOCUMENTS

| | | | | |
|---|---|---|---|---|
| 2018/0122286 A1* | 5/2018 | Wu | ........................ | G09G 3/32 |
| 2021/0183941 A1* | 6/2021 | Lee | ...................... | H10H 29/142 |
| 2022/0343837 A1* | 10/2022 | Cheng | .................. | G09G 3/2025 |
| 2022/0415964 A1* | 12/2022 | Li | ........................... | G09G 3/32 |
| 2023/0186847 A1* | 6/2023 | Uchida | ................ | G09G 3/3233 |
| | | | | 345/214 |

(Continued)

FOREIGN PATENT DOCUMENTS

| | | |
|---|---|---|
| CN | 111048544 A | 4/2020 |
| TW | 202127422 A | 7/2021 |

OTHER PUBLICATIONS

Kendall, Richard: "Driving a 8×8 RGB LED matrix with Arduino", https://rjk.codes/post/driving-a-8x8-rgb-led-matrix-with-arduino/, May 31, 2020.

(Continued)

*Primary Examiner* — Victor A Mandala
(74) *Attorney, Agent, or Firm* — Donald E. Stout; Stout, Uxa & Buyan, LLP

(57) ABSTRACT

A micro-light-emitting diode (microLED) display panel includes a plurality of microLEDs arranged in rows and columns. Anodes of microLEDs in a same row are connected to a corresponding data line, and cathodes of pixels in a same column are connected to a corresponding group of common lines, each of which is connected to cathodes of microLEDs of different colors.

5 Claims, 8 Drawing Sheets

(56)                    References Cited

U.S. PATENT DOCUMENTS

| | | | |
|---|---|---|---|
| 2023/0245614 A1* | 8/2023 | Wu | G09G 3/32 |
| | | | 345/55 |
| 2023/0274698 A1* | 8/2023 | Uchida | G09G 3/3233 |
| 2023/0317002 A1* | 10/2023 | Sakai | G09G 3/3233 |
| | | | 345/55 |
| 2025/0221123 A1* | 7/2025 | Chae | G09G 3/3225 |

OTHER PUBLICATIONS

Office Action dated Oct. 30, 2025 in corresponding Indian Patent Application No. 202314026586.

\* cited by examiner

Data 2

Data 3

500

MICROLED DISPLAY PANEL

CROSS-REFERENCE TO RELATED APPLICATIONS

This application claims the benefit of U.S. Provisional Application No. 63/329,571, filed on Apr. 11, 2022, the entire content of which is hereby incorporated by reference.

BACKGROUND OF THE INVENTION

1. Field of the Invention

The present invention generally relates to a microLED, and more particularly to a microLED display panel.

2. Description of Related Art

A micro-light-emitting diode (microLED, mLED or µLED) display panel is one of flat display panels, and is composed of microscopic microLEDs each having a size of 1-100 micrometers. Compared to conventional liquid crystal display panels, the microLED display panels offer better contrast, response time and energy efficiency. Although both organic light-emitting diodes (OLEDs) and microLEDs possess good energy efficiency, the microLEDs, based on group III/V (e.g., GaN) LED technology, offer higher brightness, higher luminous efficacy and longer lifespan than the OLEDs.

The microLED display panels may be mainly divided into a common-anode scheme with anodes in the same row connected together, and a common-cathode scheme with cathodes in the same column connected together. Conventional common-anode microLED display panel suffers uneven electrical load, and conventional common-cathode microLED display panel disadvantageously requires more data lines.

A need has thus arisen to propose a novel scheme to overcome drawbacks of the conventional microLED display panels.

SUMMARY OF THE INVENTION

In view of the foregoing, it is an object of the embodiment of the present invention to provide a common-anode microLED display panel with even electrical loads among common lines, and a common-cathode microLED display panel with fewer data lines.

According to a first embodiment, a microLED display panel includes a plurality of microLEDs arranged in rows and columns. Anodes of microLEDs in a same row are connected to a corresponding data line, and cathodes of pixels in a same column are connected to a corresponding group of common lines, each of which is connected to cathodes of microLEDs of different colors.

According to a second embodiment of the present invention, a microLED display panel includes a plurality of microLEDs arranged in rows and columns. Anodes of microLEDs of same color in a same row are connected to a corresponding data line, and cathodes of pixels in a same column are connected to a corresponding group of common lines, each of which is connected to cathodes of microLEDs of different colors.

According to a third embodiment of the present invention, a microLED display panel includes a timing controller; a plurality of drivers controlled by the timing controller; and a plurality of blocks each is driven by a corresponding driver. Neighboring blocks are driven with different colors at a time.

According to a fourth embodiment of the present invention, a microLED display panel includes a plurality of microLEDs arranged in rows and columns, neighboring red microLED, green microLED and blue microLED disposed vertically constituting a pixel, and a plurality of neighboring pixels disposed vertically constituting a pixel group. Anodes of microLEDs of same color in a same row are connected to a corresponding data line, which is shared among pixels of a same pixel group, and cathodes of pixels of the pixel group are respectively connected to corresponding common lines, which are shared with pixel groups of a same column.

DETAILED DESCRIPTION OF THE INVENTION

Figures 1A, 1B:
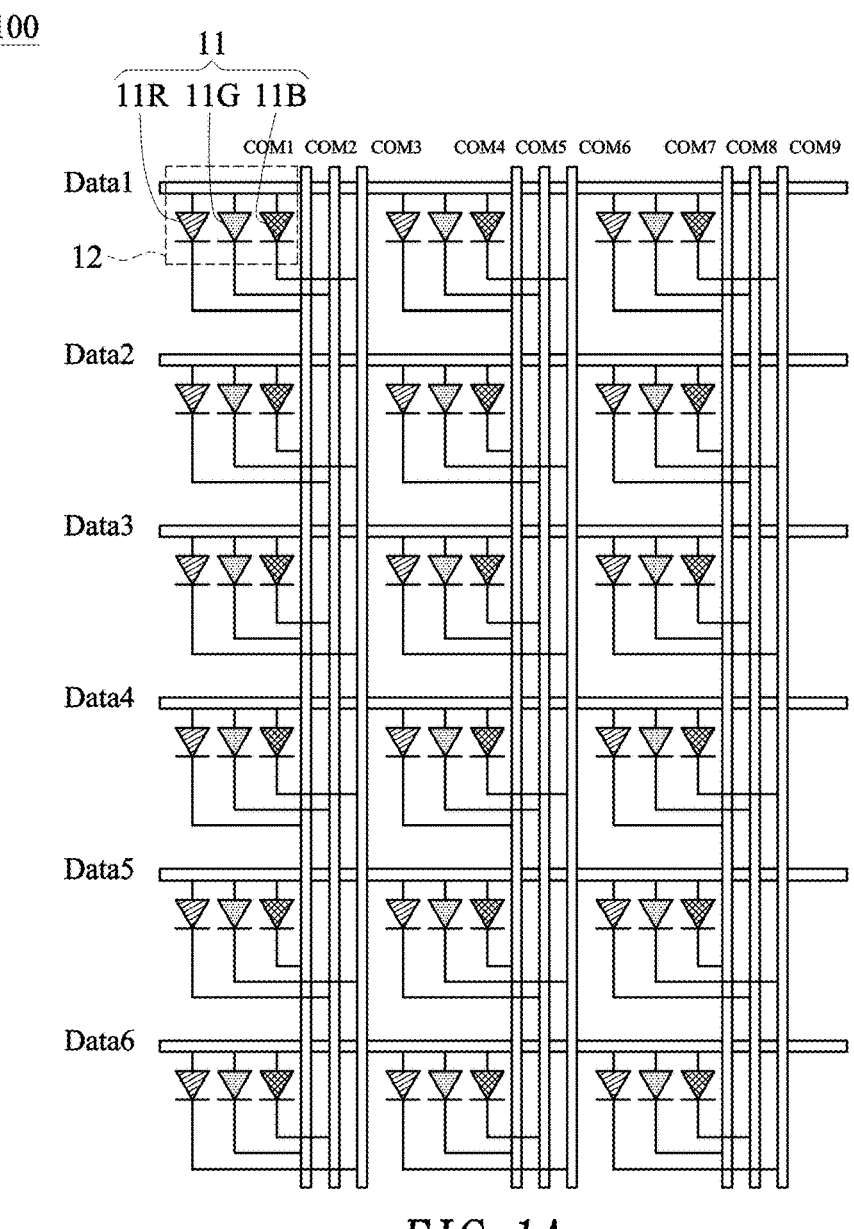
FIG. 1A shows a circuit diagram illustrating a micro-light-emitting diode (microLED) display panel according to a first embodiment of the present invention.
FIG. 1B to FIG. 1D show exemplary timing diagrams adaptable to driving the microLED display panel of FIG. 1A.

FIG. 1A shows a circuit diagram illustrating a micro-light-emitting diode (microLED) display panel 100 according to a first embodiment of the present invention. Specifically, the microLED display panel 100 of the embodiment may include a plurality of microLEDs 11, such as red microLEDs 11R, green microLEDs 11G and blue microLEDs 11B, arranged in rows and columns. Neighboring red microLED 11R, green microLED 11G and blue microLED 11B disposed laterally constitute a pixel 12.

In the embodiment, anodes of microLEDs 11 in a same row are connected to a corresponding (single) data line (Data). Cathodes of pixels 12 in a same column are connected to a corresponding group of common lines (COM), each of which is connected to (cathodes of) microLEDs 11 of different colors, for example, red microLEDs 11R, green microLEDs 11G and blue microLEDs 11B. In one embodiment, amount of red microLEDs 11R, amount of green microLEDs 11G and amount of blue microLEDs 11B connected to the common line are substantially the same. Accordingly, electrical loads among common lines are substantially the same, and the common lines may thus be designed with the same width.

Figure 1C:
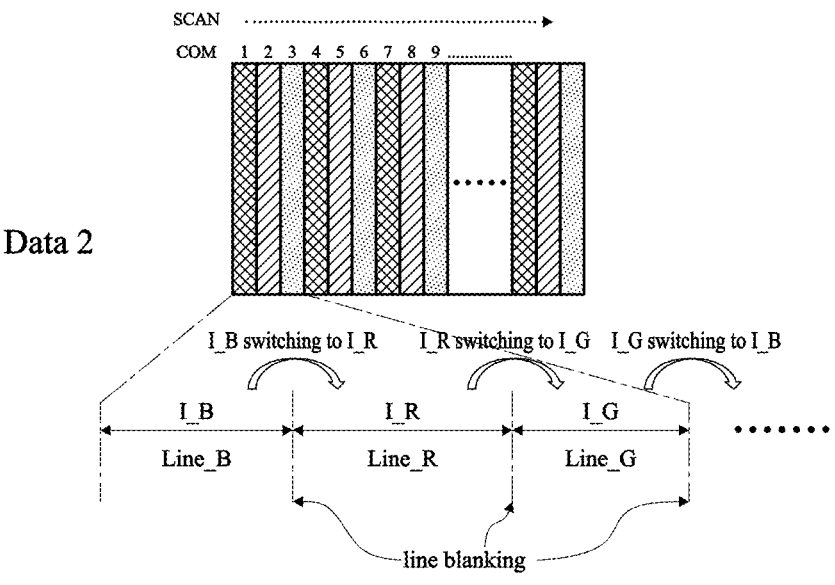
Figure 1D:
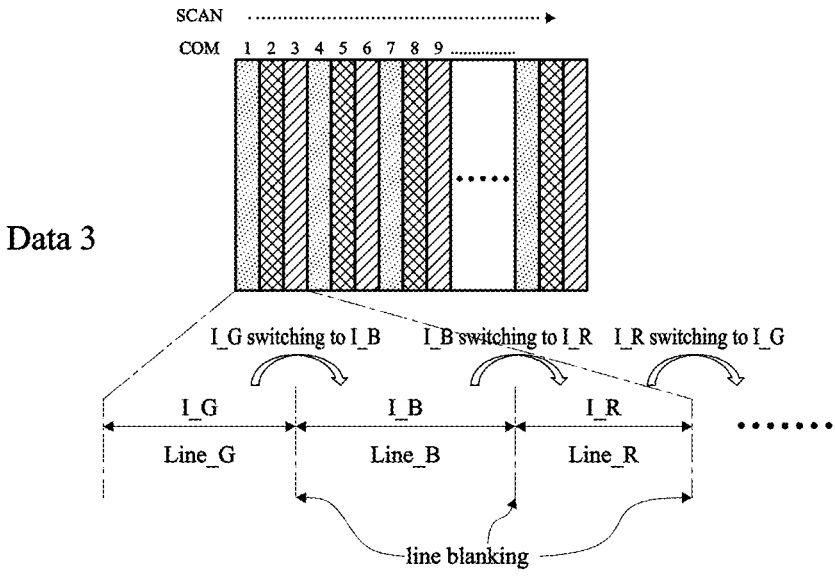

FIG. 1B to FIG. 1D show exemplary timing diagrams adaptable to driving the microLED display panel 100 (of FIG. 1A). Specifically, the common lines are driven (or scanned) in sequence, for example, COM1, COM2, COM3, etc. As exemplified in FIG. 1B, red (image) data and associated electric current information I_R are provided at data line Data 1 while scanning the first common line COM1, green (image) data and associated electric current information I_G are provided at data line Data 1 while scanning the second common line COM2, and blue (image) data and associated electric current information I_B are provided at data line Data 1 while scanning the third common line COM3. It is noted that the electric current information (associated with data line) may be provided during line blanking interval (between adjacent common lines), and image data are provided at the data lines with different color sequences respectively.

Figures 2A, 2B:
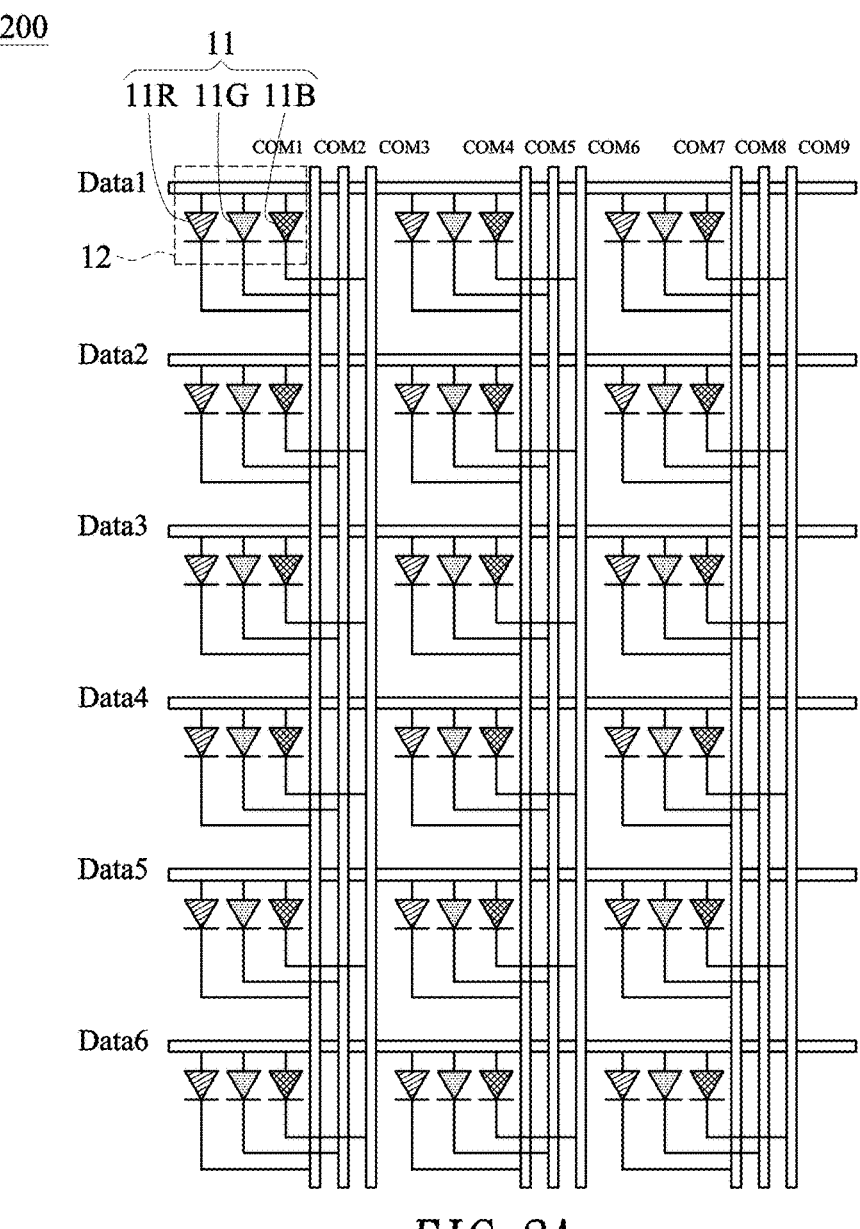
FIG. 2A shows a circuit diagram illustrating a microLED display panel without adopting the arrangement of FIG. 1A.
FIG. 2B shows an exemplary timing diagram adaptable to driving the microLED display panel of FIG. 2A.

FIG. 2A shows a circuit diagram illustrating a microLED display panel 200 without adopting the arrangement of FIG. 1A. In the microLED display panel 200, each common line is connected to cathodes of microLEDs 11 (of the same color) in a same column. As electrical loads among common lines (of a group) are different, the common lines should be designed with different widths. Usually, all common lines are designed with the maximum width, thereby suffering low aperture ratio (that is, the ratio of light transmissive area to total pixel area).

FIG. 2B shows an exemplary timing diagram adaptable to driving the microLED display panel 200 (of FIG. 2A). Similar to FIGS. 1B-1D, the electric current information (associated with data line) may be provided during line blanking interval (between adjacent common lines), but image data are provided at the data lines with same color sequence.

Figures 3A, 3B:
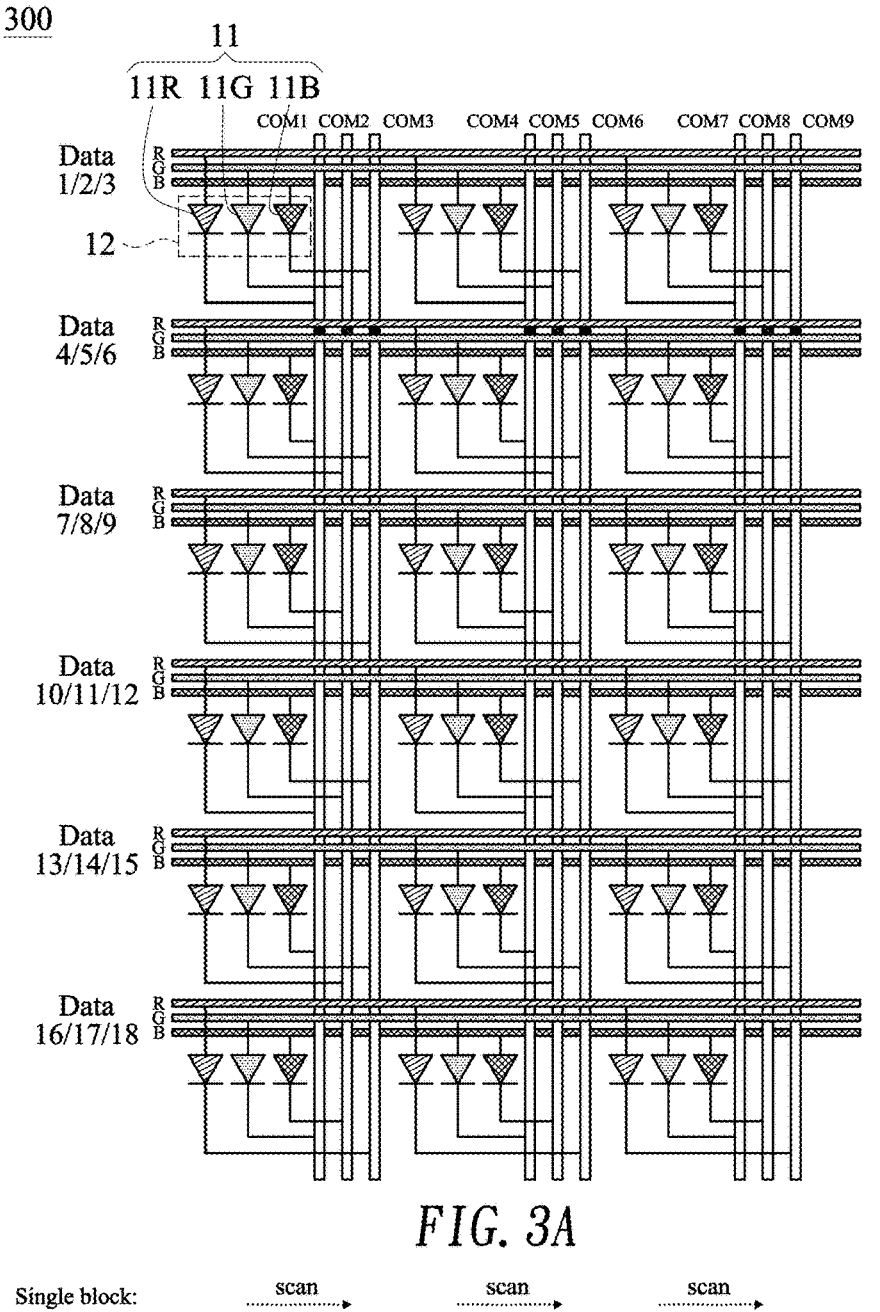
FIG. 3A shows a circuit diagram illustrating a microLED display panel according to a second embodiment of the present invention.
FIG. 3B shows an exemplary timing diagram adaptable to driving the microLED display panel of FIG. 3A and the microLED display panel of FIG. 1A.

FIG. 3A shows a circuit diagram illustrating a microLED display panel 300 according to a second embodiment of the present invention. The microLED display panel 300 (of FIG. 3A) is similar to the microLED display panel 100 (of FIG. 1A) with the exceptions as follows.

In the embodiment, anodes of microLEDs 11 of same color in a same row are connected to a corresponding data line. It is noted that amount of data lines required in the embodiment is three times the amount of data lines in the microLED display panel 100.

FIG. 3B shows an exemplary timing diagram adaptable to driving the microLED display panel 300 (of FIG. 3A) and the microLED display panel 100 (of FIG. 1A). Specifically, fields of common lines 3N+1 (N is non-negative integer), 3N+2 and 3N+3 are driven (or scanned) sequentially. For example, a first field of common lines COM1, COM4, COM7 . . . are driven, followed by a second field of common lines COM2, COM5, COM8 . . . , and a third field of common lines COM3, COM6, COM9 . . . . As exemplified in FIG. 3B, constant currents are switched only twice in a frame, for example, first switching from the constant current I_R associated with the red microLED 11R to the constant current I_G associated the green microLED 11G and second switching from the constant current I_G associated with the green microLED 11G to the constant current I_B associated the blue microLED 11B. Therefore, frequent switching of the constant currents can be prevented. It is noted that the electric current information (associated with data line) may be provided during field blanking interval (between adjacent fields of common lines), thereby preventing frequent switching between different colors as in FIG. 2B or FIGS. 1B-1D.

Figure 4A:
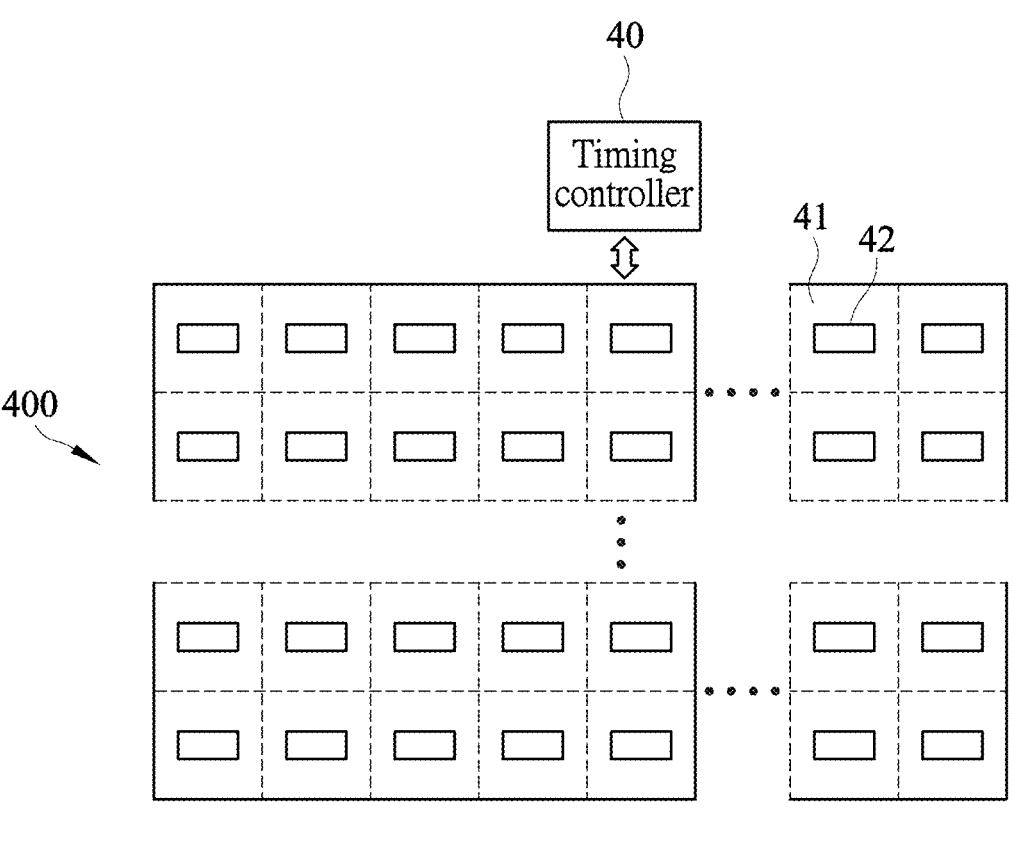
FIG. 4A schematically shows a top view of a microLED display panel according to a third embodiment of the present invention.
Figure 4B:
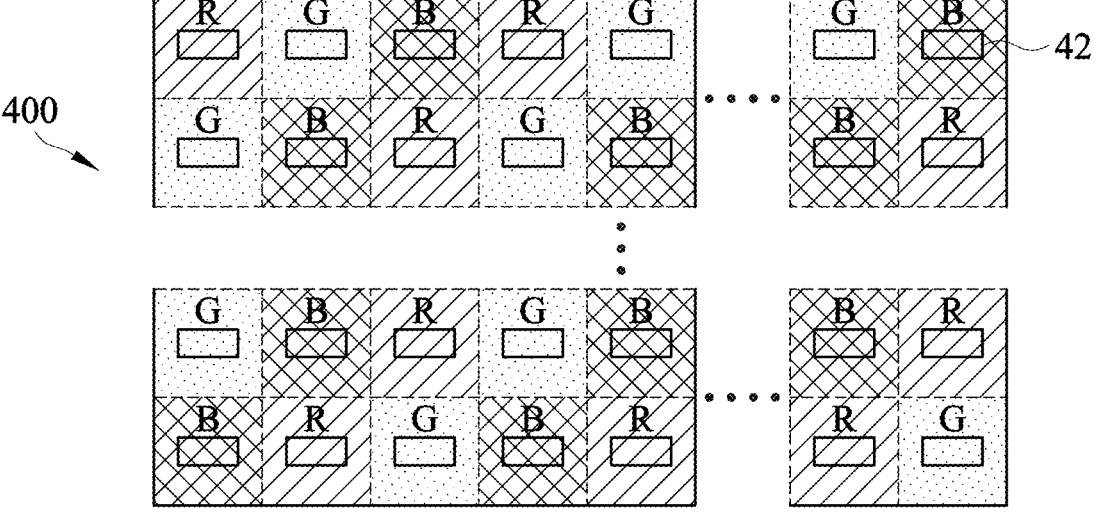
FIG. 4B to FIG. 4D show an exemplary sequence of driving the blocks of FIG. 4A by the timing controller.
Figure 4C:
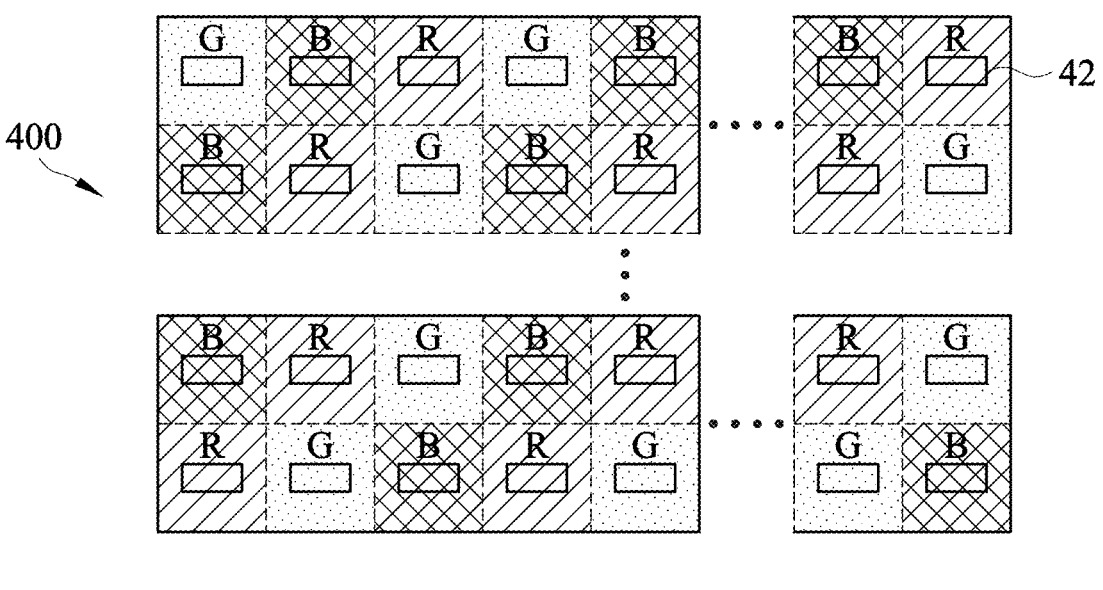
Figure 4D:
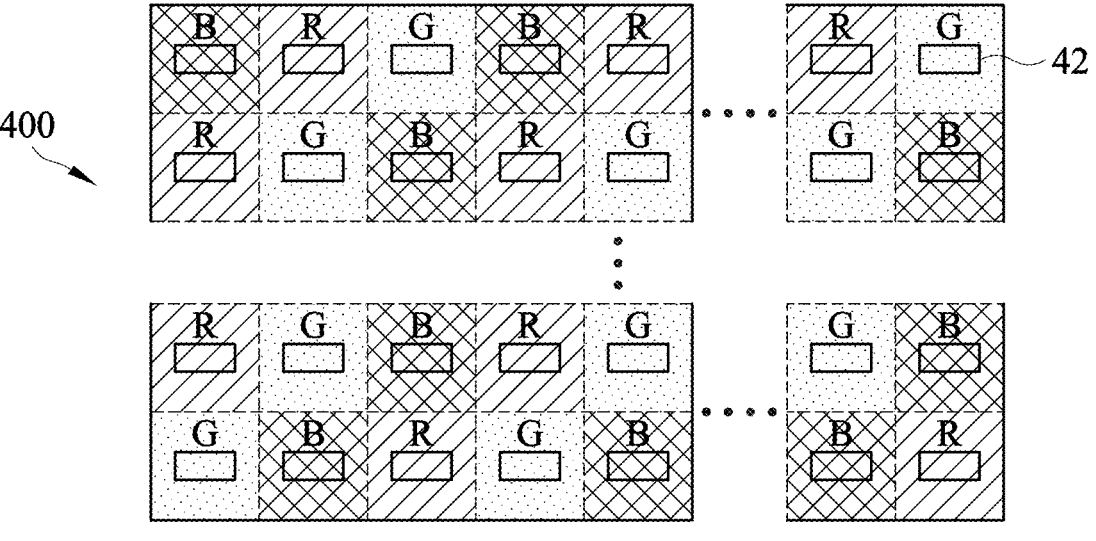

FIG. 4A schematically shows a top view of a microLED display panel 400 according to a third embodiment of the present invention. Specifically, the microLED display panel 400, controlled by a timing controller 40, may include a plurality of blocks 41 each is driven by a corresponding driver 42. FIG. 4B to FIG. 4D show an exemplary sequence of driving the blocks 41 (of FIG. 4A) by the timing controller 40. According to one aspect of the embodiment, neighboring blocks 41 are driven with different colors at a time. Particularly, any three blocks 41 adjacently disposed laterally are driven with (three) different colors at a time. Accordingly, electrical loads among blocks 41 are substantially the same.

Figure 5A:
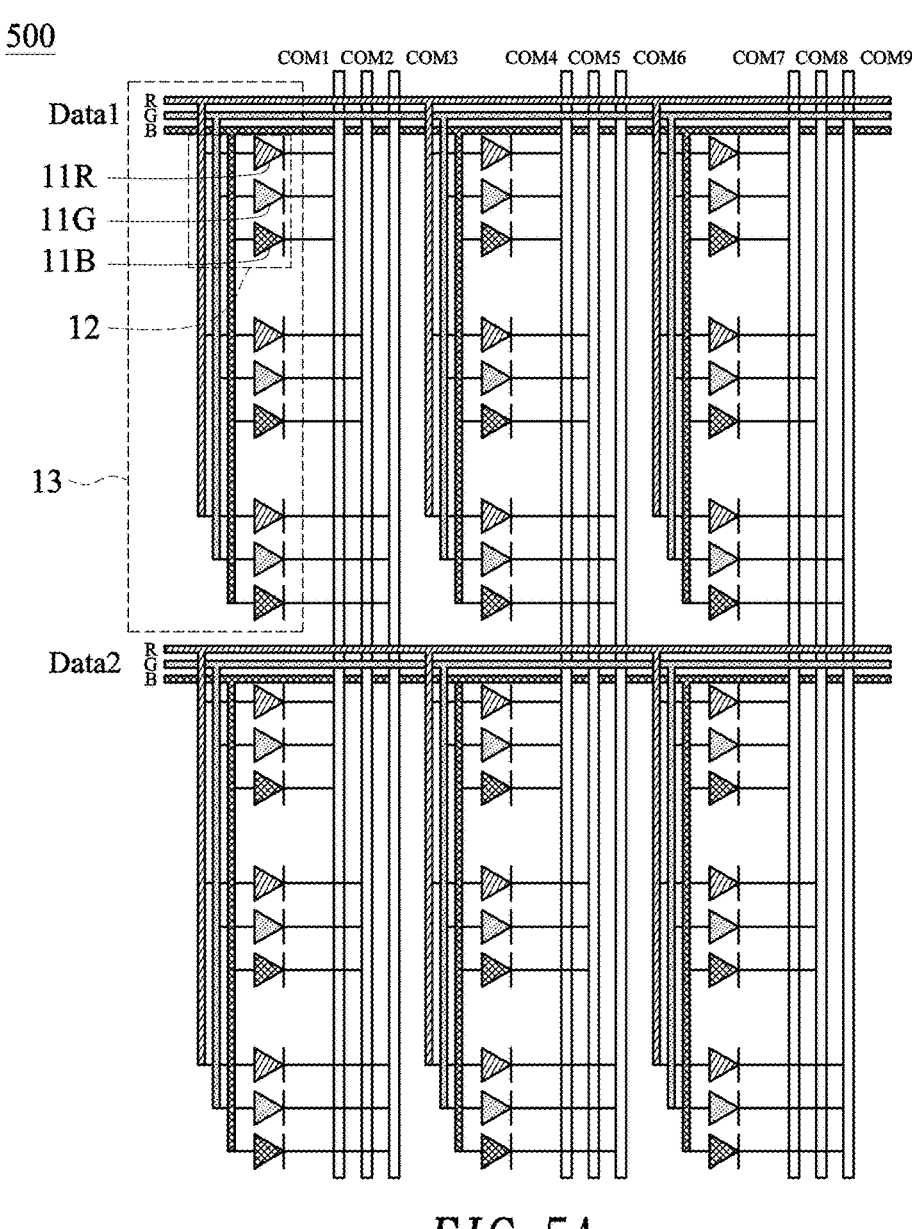
FIG. 5A shows a circuit diagram illustrating a microLED display panel according to a fourth embodiment of the present invention.
Figure 5B:
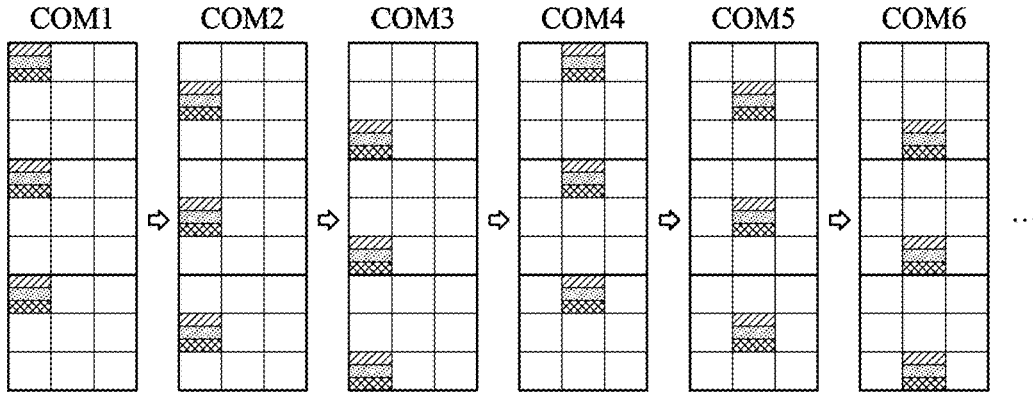
FIG. 5B shows an exemplary sequence of driving the microLED display panel of FIG. 5A in a time-sharing manner.

FIG. 5A shows a circuit diagram illustrating a microLED display panel 500 according to a fourth embodiment of the present invention. Specifically, neighboring red microLED 11R, green microLED 11G and blue microLED 11B disposed vertically constitute a pixel 12, and a plurality of (e.g., three) neighboring pixels 12 disposed vertically constitute a pixel group 13. Anodes of microLEDs 11 of same color in a same row are connected to a corresponding data line, which is shared among pixels 12 of a same pixel group 13. Cathodes of pixels 12 of the pixel group 13 are respectively connected to corresponding common lines, which are shared with pixel groups 13 of a same column. For example, the cathodes of the first pixel 12 are connected to the first common line COM1, the cathodes of the second pixel 12 are connected to the second common line COM2, and the cathodes of the third pixel 12 are connected to the third common line COM3. FIG. 5B shows an exemplary sequence of driving the microLED display panel 500 of FIG. 5A in a time-sharing manner.

Figure 6:
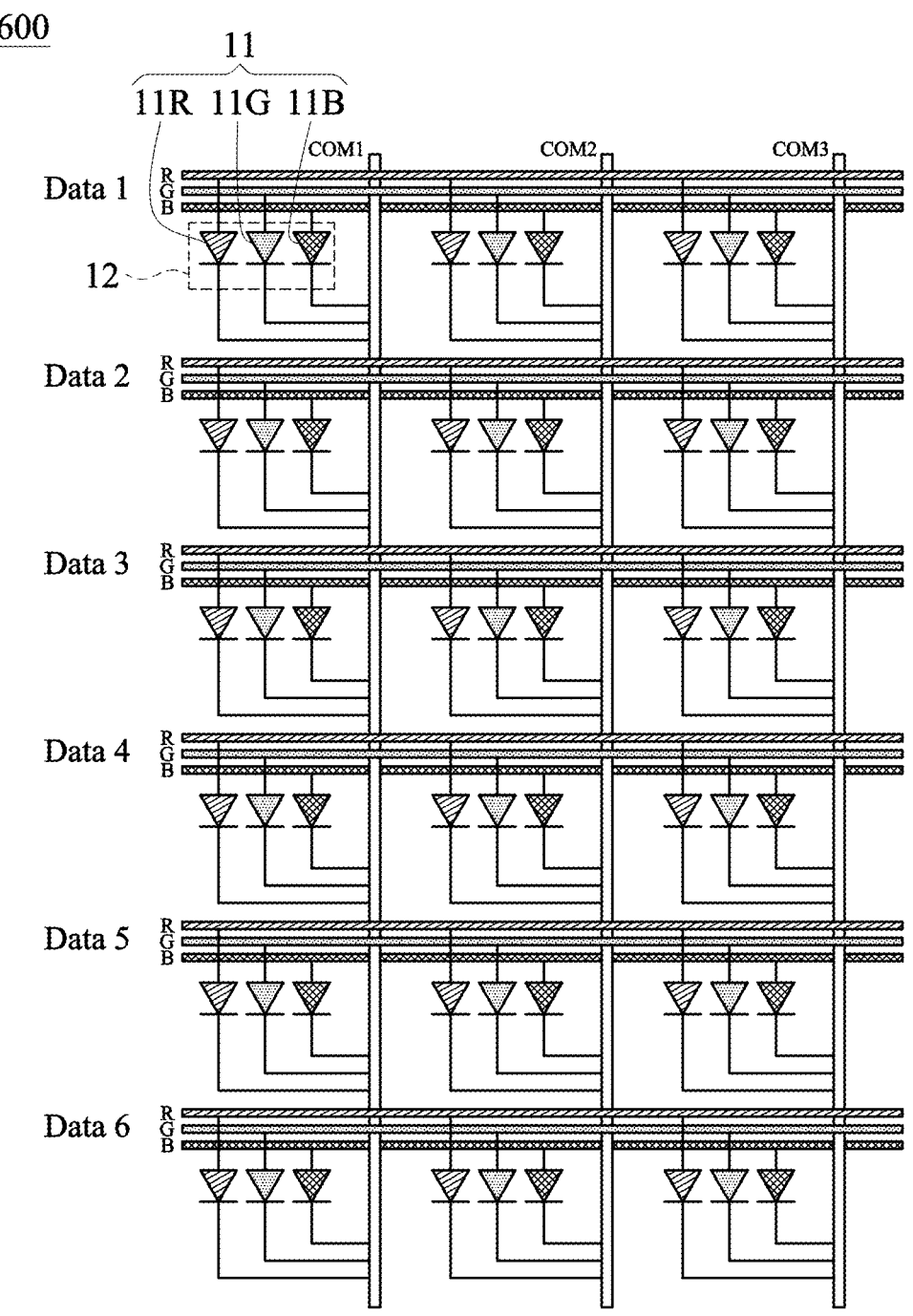
FIG. 6 shows a circuit diagram illustrating a microLED display panel without adopting the arrangement of FIG. 5A.

FIG. 6 shows a circuit diagram illustrating a microLED display panel 600 without adopting the arrangement of FIG. 5A. Specifically, neighboring red microLED 11R, green microLED 11G and blue microLED 11B disposed laterally constitute a pixel 12. Anodes of microLEDs 11 of same color in a same row are connected to a corresponding data line. Cathodes of pixels 12 in a same column are connected to a common line. Compared to the microLED display panel 500, the microLED display panel 600 possesses fewer common lines but more data lines.

Although specific embodiments have been illustrated and described, it will be appreciated by those skilled in the art that various modifications may be made without departing from the scope of the present invention, which is intended to be limited solely by the appended claims.

What is claimed is:

1. A micro-light-emitting diode (microLED) display panel, comprising:
   a plurality of microLEDs arranged in rows and columns;
   wherein anodes of microLEDs in a same row are connected to a corresponding data line, and cathodes of pixels in a same column are connected to a corresponding group of common lines, each of which is connected to cathodes of microLEDs of different colors.

2. The microLED display panel of claim 1, wherein neighboring red microLED, green microLED and blue microLED disposed laterally constitute a pixel.

3. The microLED display panel of claim 1, wherein amount of red microLEDs, amount of green microLEDs and amount of blue microLEDs connected to a common line are the same.

4. The microLED display panel of claim 1, wherein common lines are driven in sequence, and image data are provided at data lines with different color sequences respectively.

5. The microLED display panel of claim 1, wherein fields of common lines 3N+1, 3N+2 and 3N+3 are driven sequentially, N being a non-negative integer.

\* \* \* \* \*